US006459103B1

(12) United States Patent
Liu et al.

(10) Patent No.: US 6,459,103 B1
(45) Date of Patent: Oct. 1, 2002

(54) NEGATIVE-DIFFERENTIAL-RESISTANCE HETEROJUNCTION BIPOLAR TRANSISTOR WITH TOPEE-SHAPED CURRENT-VOLTAGE CHARACTERISTICS

(75) Inventors: Wen-Chau Liu, Tainan (TW); Wei-Chou Wang, Tainan (TW); Shiou-Ying Cheng, Tainan (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/491,441

(22) Filed: Jan. 26, 2000

(51) Int. Cl.[7] .................... H01L 29/73; H01L 29/737
(52) U.S. Cl. ..................... 257/197; 257/14; 257/25; 257/198; 257/591
(58) Field of Search .................. 257/582, 583, 257/198, 197, 591–593, 14, 25, 12

(56) References Cited

U.S. PATENT DOCUMENTS

| | | | | |
|---|---|---|---|---|
| 4,686,550 A | * | 8/1987 | Capasso et al. ............ 357/16 |
| 4,704,622 A | * | 11/1987 | Capasso et al. ............ 357/4 |
| 4,999,697 A | * | 3/1991 | Capasso et al. ............ 357/34 |
| 5,049,955 A | * | 9/1991 | Freeouf et al. ............ 357/22 |
| 5,151,618 A | * | 9/1992 | Yokoyama et al. ......... 307/471 |
| 5,682,040 A | * | 10/1997 | Imanishi .................... 257/12 |
| 5,965,931 A | * | 10/1999 | Wang et al. ................ 257/585 |
| 5,977,572 A | * | 11/1999 | Liu et al. ................... 257/198 |
| 6,043,520 A | * | 3/2000 | Yamamoto et al. ......... 257/198 |

* cited by examiner

Primary Examiner—Eddie Lee
Assistant Examiner—Bradley W. Baumeister
(74) Attorney, Agent, or Firm—J.C. Patents

(57) ABSTRACT

An InP/InGaAlAs heterojunction bipolar transistor with the characteristics of amplification and negative-differential-resistance phenomenon is presented in the invention. The 3-terminal current-voltage characteristics of the heterojunction bipolar transistor can be controlled by the applied base current. In the large collector current regime, the heterojunction bipolar transistor has the characteristics as similar to conventional bipolar junction transistors. However, in a small collector current regime, both the transistor active region and negative-differential-resistance loci are observed. The negative-differential-resistance phenomenon is caused by the insertion of a thin base layer and a δ-doped sheet. Moreover, the use of a setback layer with a thickness of 50 Å added at the emitter-base junction can suppress the diffusion of doping impurity in the base and reduce the potential spike at emitter-base heterojunction so as to improve the confinement of holes injected from base to emitter.

47 Claims, 7 Drawing Sheets

1

NEGATIVE-DIFFERENTIAL-RESISTANCE HETEROJUNCTION BIPOLAR TRANSISTOR WITH TOPEE-SHAPED CURRENT-VOLTAGE CHARACTERISTICS

BACKGROUND OF THE INVENTION

1. Field of the Invention

The invention relates to a heterojunction bipolar transistor (HBT), and in particular to an HBT with the interesting and different characteristics of amplification and the negative-differential-resistance (NDR) phenomenon under the applied different base current.

2. Description of the Related Art

A conventional HBT is worldwide applied on commerce and military systems. Since a conventional NDR device can simplify circuit design, it is always applied on logic circuits or high-frequency oscillation circuits. When the conventional NDR device is applied on microwave circuits, NDR phenomena are always observed in the large collector current regime. For power transistors, the NDR phenomena are caused by an uneven current distribution and thermal effect on forked electrodes. This results in a lower current gain and unstable characteristics. The NDR phenomenon is rarely observed in the small collector current region. Most disclosed researches considered that the very thin base is a main reason to cause the NDR phenomena. The N-shaped NDR phenomenon is always observed in the large collector current regime. However, both the transistor active regime and NDR loci are observed in the proposed HBT device.

SUMMARY OF THE INVENTION

The invention is to provide an HBT with the common-emitter current-voltage (I-V) characteristics of amplification and the NDR phenomena based on the InP/InGaAlAs material system with a conduction band discontinuity of $0.75\Delta E_g$ ($\Delta E_g$ is the difference of energy gap between InP and InGaAlAs). Besides, a setback layer with a thickness of 50 Å is added at the emitter-base heterojunction to reduce the potential spike. The δ-doped sheet is added at the junction between the emitter and setback layer to cooperate with a base width modulation effect caused by the thin base layer. As a result, the HBT of the presented invention can provide four operation regimes which are significantly different from those of the conventional HBT's.

The invention is to provide an HBT with a transistor active region for amplification and NDR loci simultaneously. Under large base currents, such as $I_B$=100 μA/step, the current gain up to 28 is obtained. However, under a small base current, such as $I_B$=2 μA/step, an interesting topee-shaped output I-V characteristics is observed. Therefore, both the transistor active region and NDR loci exist simultaneously in the I-V characteristics. Under the applied base current of $I_B$=2 μA/step, the current gain can reach 10. In addition, in the NDR region, the peak-to-valley current ratio is 11. As can be seen from above, under the different applied base currents, the operation of the HBT device can be controlled.

Furthermore, the invention is to provide an HBT with both the transistor active region for amplification and NDR loci. In the structure of the proposed HBT, Al-quaternary material (InGaAlAs) of base and collector layers, which are lattice matched to the InP substrate, are employed. Higher electron mobility and wider modulation of energy gap of InGaAlAs provide a good candidate for high-speed and high-power electronic devices.

BRIEF DESCRIPTION OF THE DRAWINGS

The invention will be more fully understood from the detailed description given below and the accompanying drawings, which are given by way of illustration only, and thus do not limit the present invention, and wherein.

DESCRIPTION OF THE PREFERRED EMBODIMENTS

Figure 1:
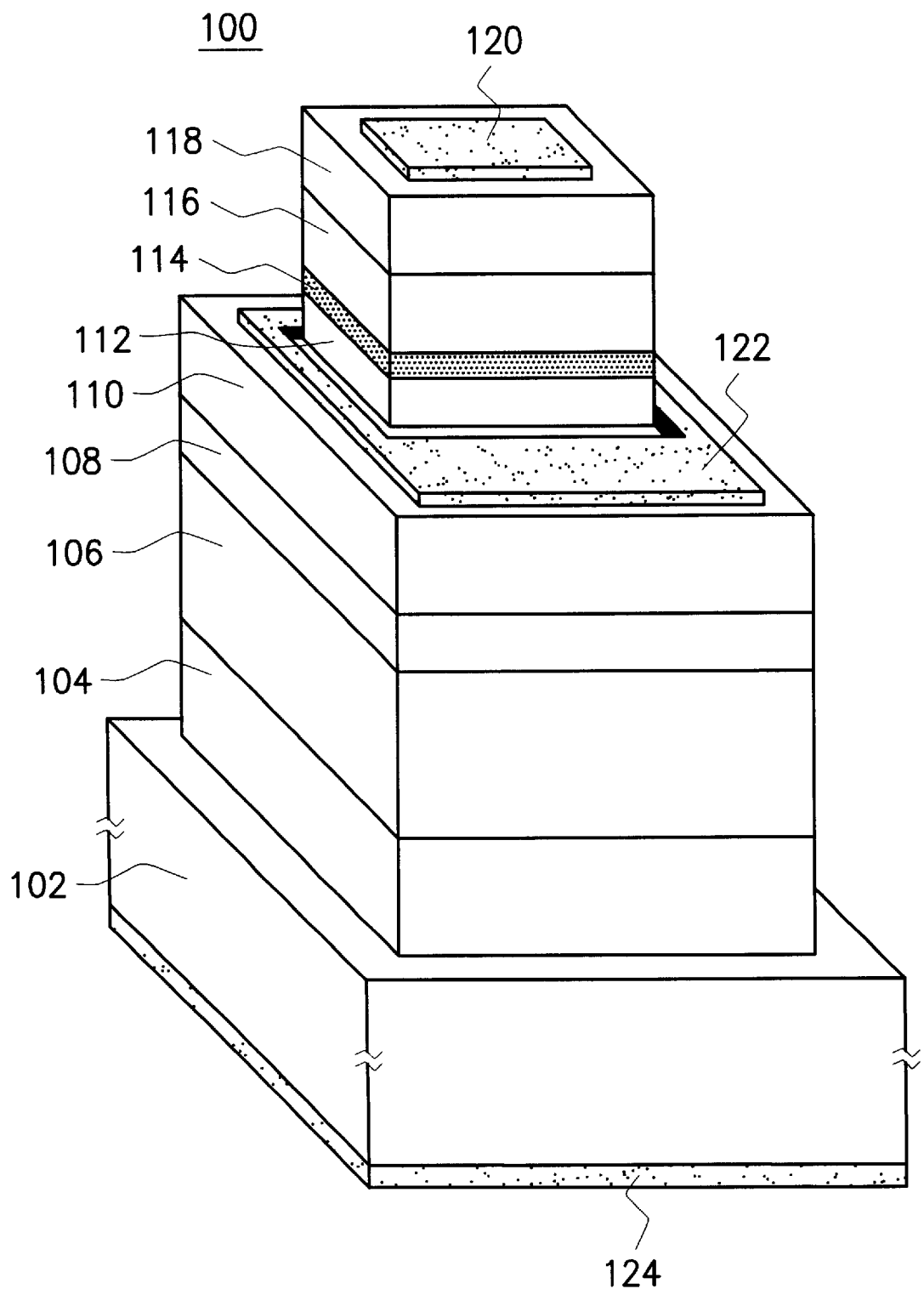
FIG. 1 is a schematic cross section of an HBT with topee-shaped NDR I-V characteristics.

Referring to FIG. 1, an HBT 100 with topee-shaped NDR characteristics according to a preferred embodiment of the invention is shown. The HBT 100 is grown by a LP-MOCVD system. The epitaxial layers, include from the bottom to the top: (1) a collector metal contact layer 124; (2) an n$^+$-type InP substrate 102; (3) an n$^+$-type InP sub-collector layer 104 with a thickness of 2000 Å and a concentration of $5\times10^{18}$cm$^{-3}$; (4) an In$_{0.53}$Ga$_{0.23}$Al$_{0.24}$As collector layer 106 with a thickness of 3000 Å and a concentration of $5\times10^{16}$cm$^{-3}$; (5) an undoped In$_{0.53}$Ga$_{0.23}$Al$_{0.24}$As setback layer 108 with a thickness of 50 Å; (6) a p$^+$-type In$_{0.53}$Ga$_{0.23}$Al$_{0.24}$As base layer 110 with a thickness of about 100 Å~400 Å, and is preferably 350 Å and a concentration of $5\times10^{18}$cm$^{-3}$; (7) a base metal contact layer 122; (8) an undoped In$_{0.53}$Ga$_{0.23}$Al$_{0.24}$As setback layer 112 with a thickness of 50 Å; (9) a δ-doped (n$^+$-type) sheet 114 with a concentration of about $10^{12}$cm$^{-2}$~$10^{13}$cm$^{-2}$, and is preferably about $10^{12}$cm$^{-2}$; (10) an n-type InP emitter layer 116 with a thickness of 1000 Å and a concentration of $5\times10^{17}$cm$^{-3}$; (11) an n-type In$_{0.53}$Ga$_{0.47}$As ohmic contact layer 118 with a thickness of 3000 Å and a concentration of $3\times10^{18}$cm$^{-3}$; (12) an emitter metal contact layer 120. The substrate 102 is alternatively composed of an n+-type GaAs substrate. The sub-collector layer 104 is alternatively composed of an n+-type InGaAs layer or n+-type GaAs layer. The collector layer 106 further comprises an n-type InP layer, an n-type layer, an n-type InGaP layer or an n-type AlGaAs layer. The base control layer 110 is alternatively composed of a p+-type InGaAs layer, a p+-type GaAs layer, a p+-type InGaP layer or a p+-type AlGaAs layer. The setback layer 112 is alternatively composed of a GaAs layer or an InGaP layer. The emitter layer 116 is alternatively composed of an n-type InAlAs layer, an n-type GaAs layer, an n-type AlGaAs layer, an n-type InGaP layer or a combination of the above layers with δ-doped sheet 114. The ohmnic contact layer further includes an n+-type GaAs layer.

As to the HBT 100 of the invention, an Al-quaternary material ($In_{0.53}Ga_{0.23}Al_{0.24}As$), which is lattice matched to InP, is used to improve the voltage gain and breakdown voltage. Moreover, the setback layer 112 is added at the emitter-base junction to thereby eliminate the potential spike of the emitter-base junction at thermal equilibrium. Based on the designed thin base layer 110 and the addition of δ-doped sheet 114 at the emitter-base junction, the NDR phenomenon can be expected. The NDR HBT 100 will exhibit the topee-shaped I-V characteristics and conventional amplification properties simultaneously.

Figure 2A:
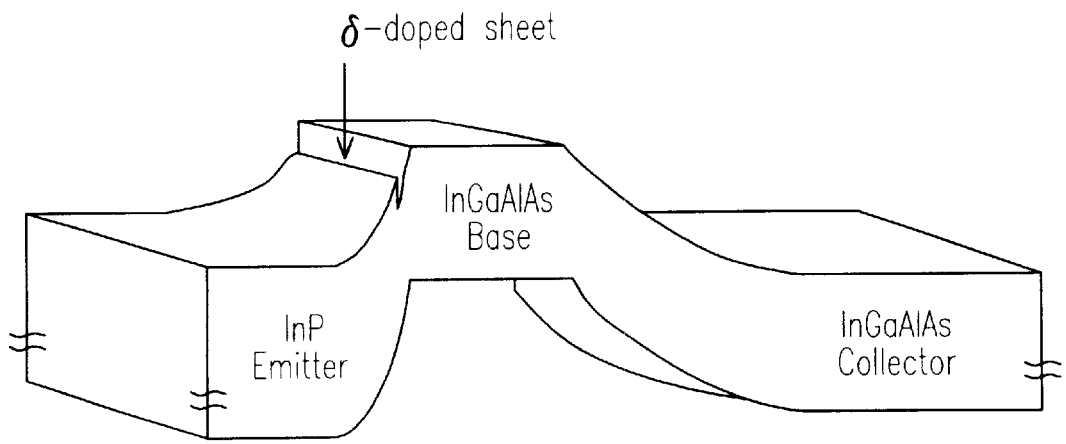
FIG. 2A is a graph showing an energy band diagram of an HBT with topee-shaped NDR characteristics at thermal equilibrium.
Figure 2B:
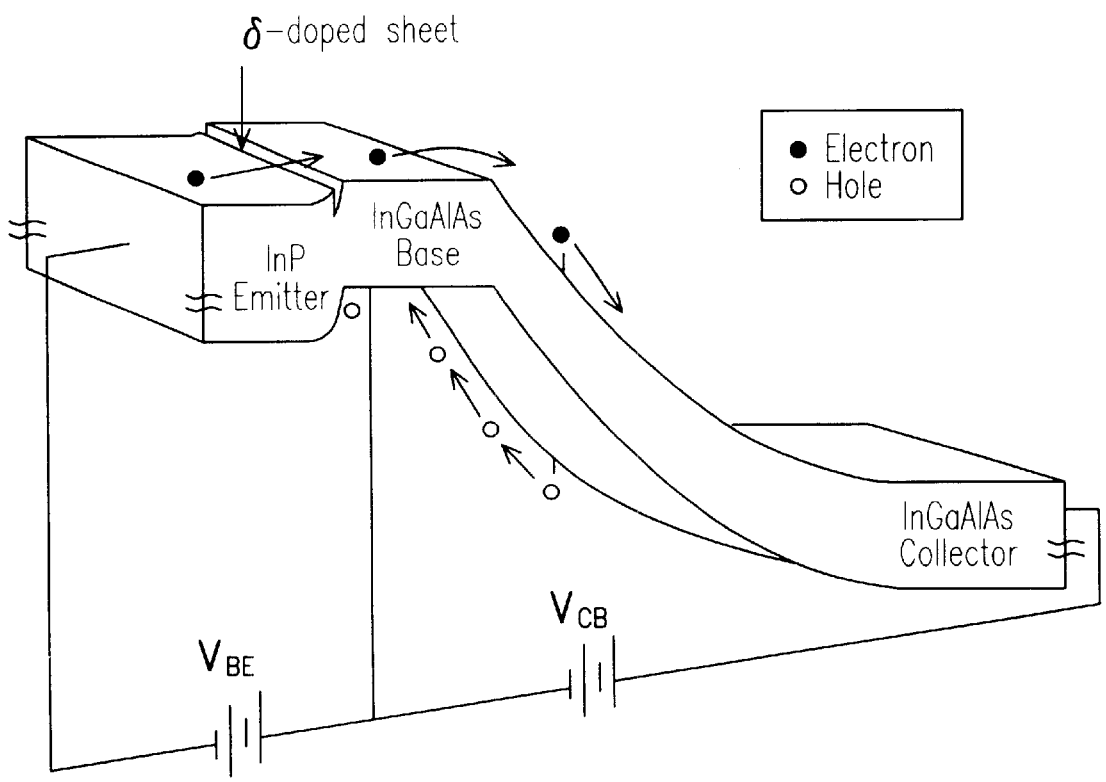
FIG. 2B is a graph showing an energy band diagram of an HBT with topee-shaped NDR characteristics under an external applied bias.

Referring to FIG. 2A, an energy band diagram of the HBT with topee-shaped NDR characteristics at thermal equilibrium is shown. FIG. 2B shows an energy band diagram of the HBT with topee-shaped NDR characteristics under the applied external bias. As can be seen from FIGS. 2A, 2B, due to the use of δ-doped sheet and the undoped setback layer, the potential spike is eliminated at thermal equilibrium. Under an external applied bias, resulting from the presence of thin base layer, the NDR phenomenon is observed due to the modulation of the potential spike at emitter-base junction.

Figure 3A:
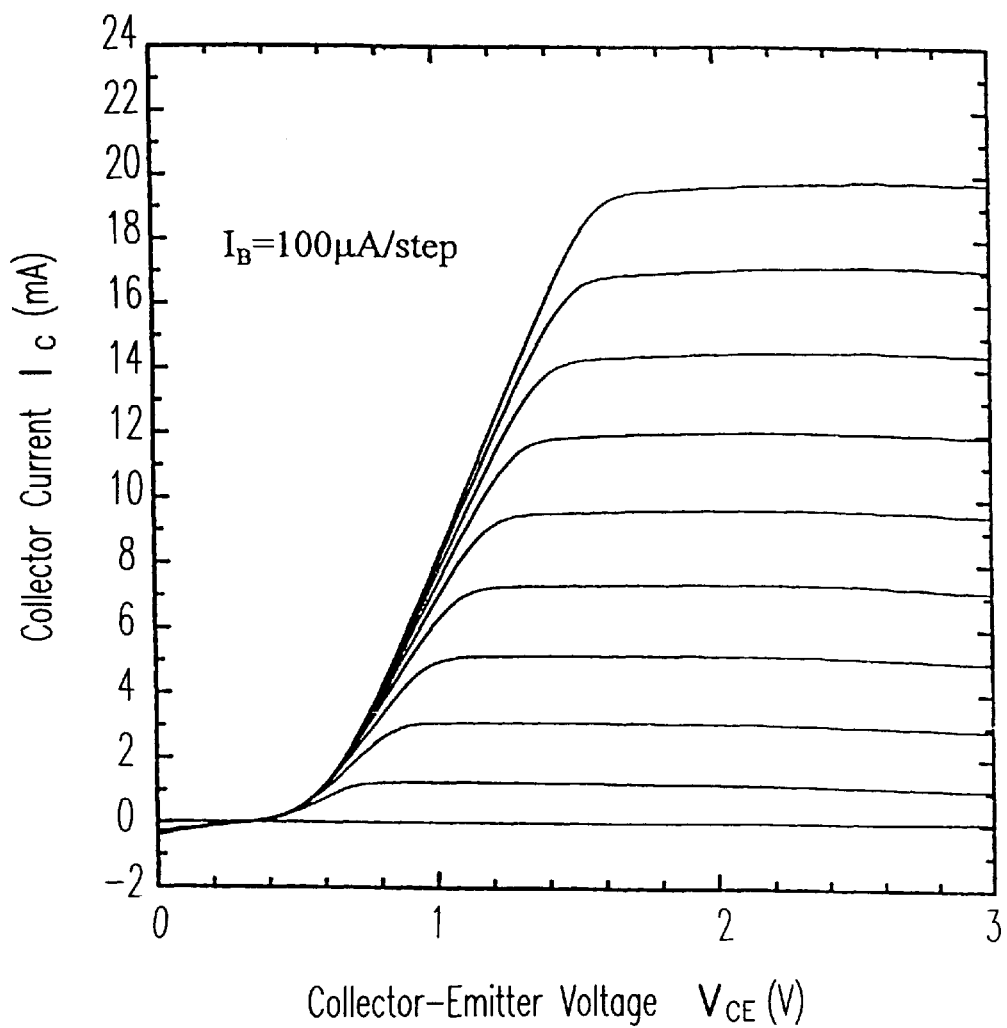
FIG. 3A is a graph showing a common-emitter I-V characteristics of an HBT with topee-shaped NDR characteristics at $I_B$=100 μA/step.
Figure 3B:
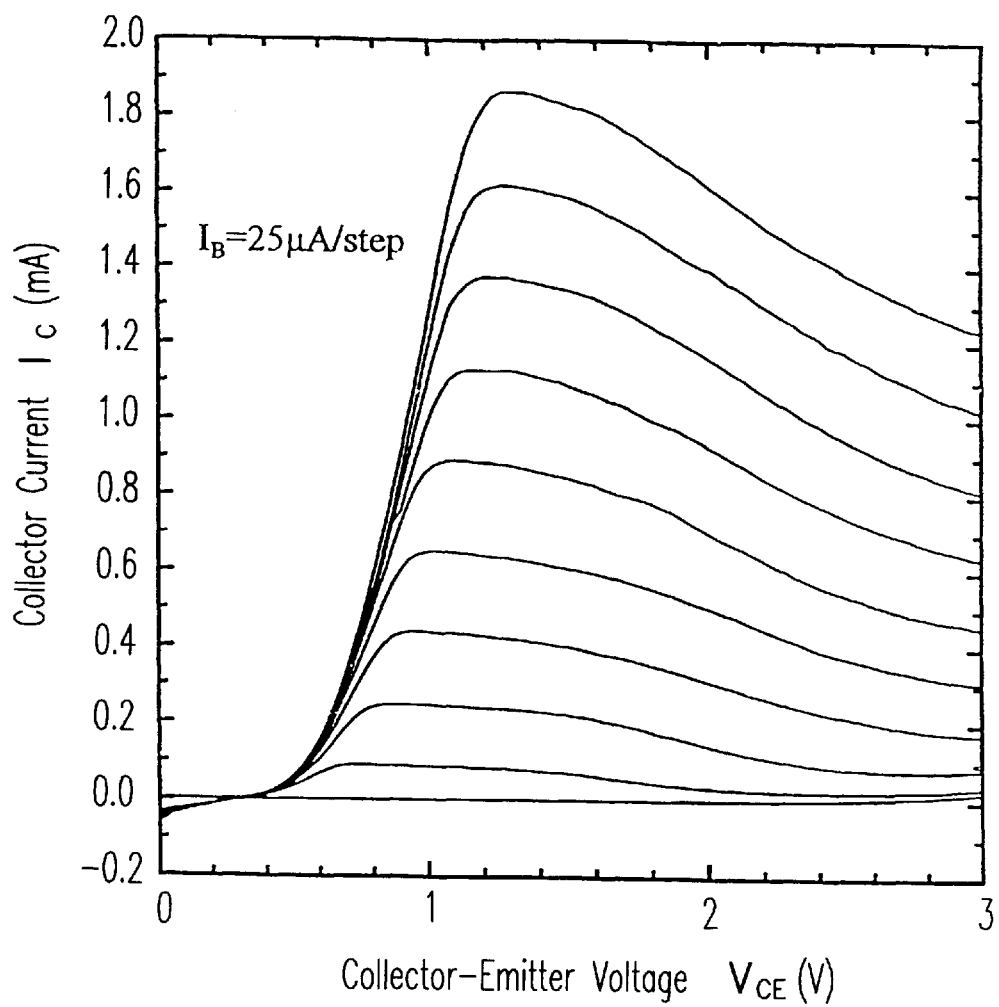
FIG. 3B is a graph showing the common-emitter I-V characteristics of an HBT with topee-shaped NDR characteristics at $I_B$=25 μA/step.
Figure 3C:
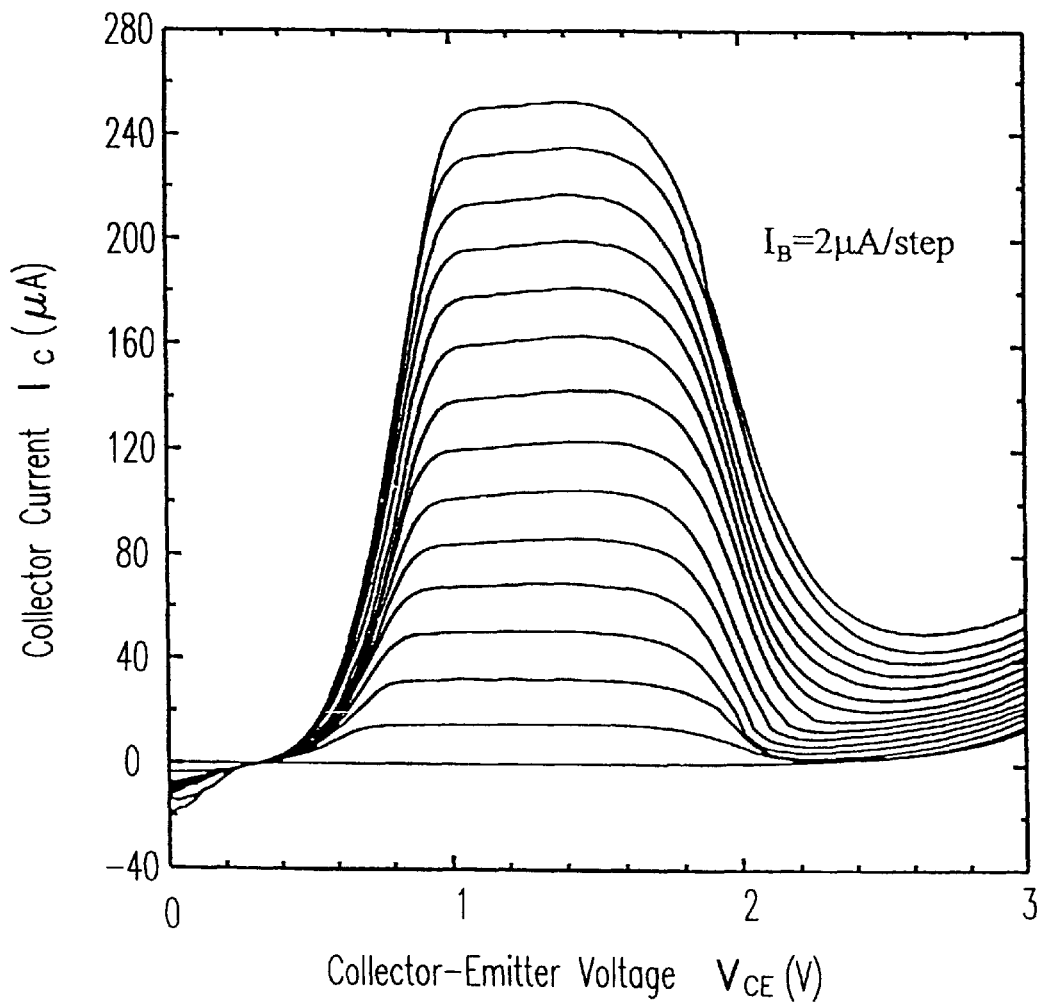
FIG. 3C is a graph showing the common-emitter I-V characteristics of an HBT with topee-shaped NDR characteristics at $I_B$=2 μA/step.

Next, FIG. 3A shows a common-emitter I-V characteristics of the HBT 100 with topee-shaped NDR characteristics under the applied base current of $I_B$=100 μA/step. FIG. 3B shows a common-emitter I-V characteristics of the HBT 100 with topee-shaped NDR characteristics under the applied base current of $I_B$=25 μA/step. FIG. 3C shows a common-emitter I-V characteristics of the HBT 100 with topee-shaped NDR characteristics under the applied base current of $I_B$=2 μA/step. In FIG. 3A, the current gain of the HBT of the invention is 28 in the large collector current regime and the I-V characteristics are similar to that of a conventional bipolar transistor. In FIG. 3B, under medium base currents, the N-shaped NDR I-V characteristics are presented. However, under small base currents, the topee-shaped I-V characteristics are presented as shown in FIG. 3C. When the collector-emitter voltage $V_{CE}$ is smaller than 1.6V, the HBT 100 still operates under the transistor active region. When $V_{CE}$ is higher than 1.6V, NDR loci are presented. Moreover, the characteristics of the transistor active region and the NDR depend on the δ-doped sheet layer and base resistance effect caused by the base width modulation.

Figure 4:
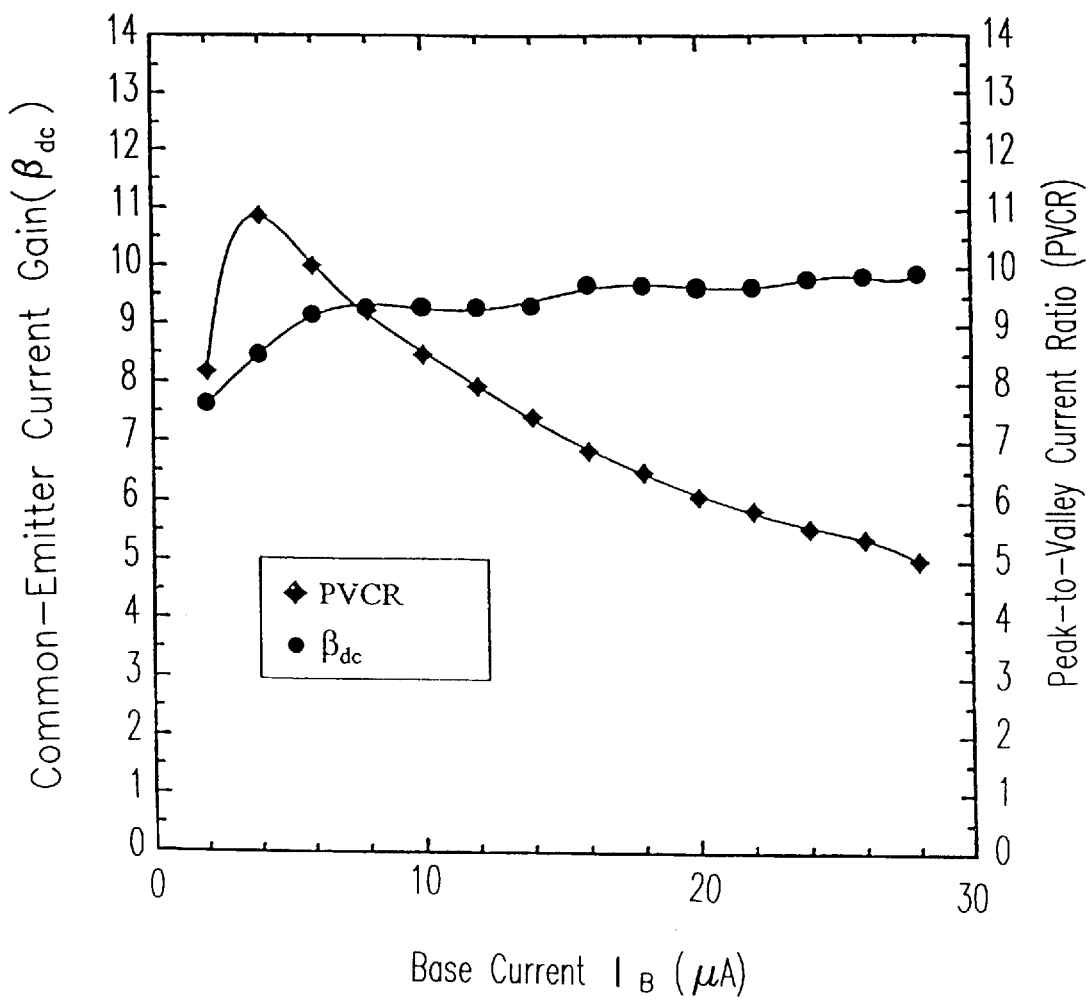
FIG. 4 is a graph showing the dependence of current gain and peak-to-valley current ratio of NDR loci on the base current of an HBT with topee-shaped NDR characteristics.

FIG. 4 shows the dependence of the current gain and peak-to-valley current ratio of NDR loci on the base current of the HBT 100 with topee-shaped NDR characteristic. As shown in FIG. 4, the maximum current gain is 10 and the peak-to-valley current ratio is 11. With the increase of the base current, the current gain is increased.

Figure 5:
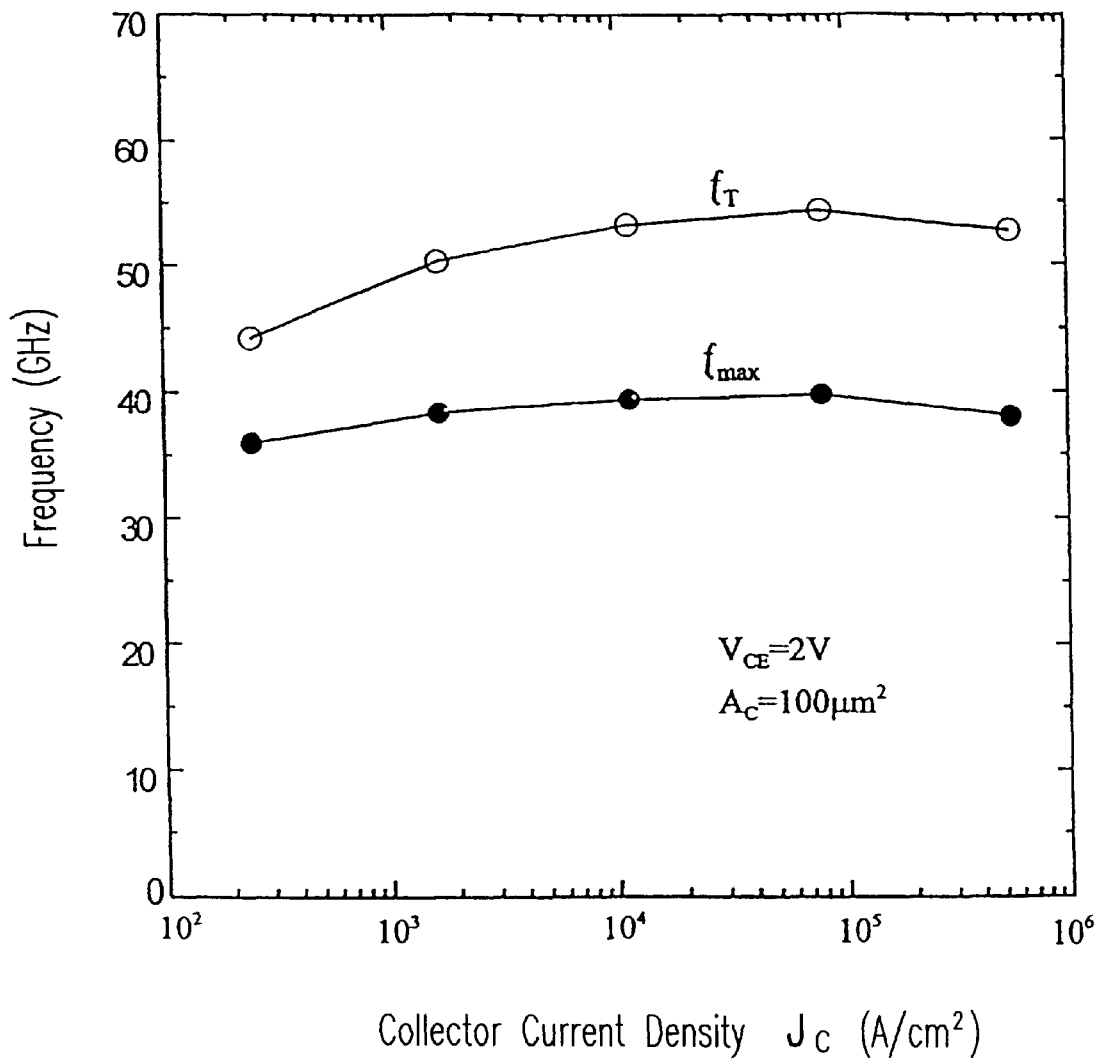
FIG. 5 is a graph showing the dependence of the calculated frequency response on the collector current density of an HBT with topee-shaped NDR characteristics.

FIG. 5 is a theoretical simulation curve showing the dependence of the frequency response on the collector current density of the HBT 100 with topee-shaped NDR characteristics. As shown in FIG. 5, at collector-emitter voltage of $V_{CE}$=2V and the collector area of 100 μcm$^2$, the unity current gain cut-off frequency $f_T$ and maximum oscillation frequency $f_{max}$ can reach 54 GHz and 40 GHz, respectively.

In summary, based on an HBT with topee-shaped NDR characteristics of the invention, in the small collector current region, the topee-shaped I-V characteristics including a transistor active region for amplification and an NDR region can be obtained simultaneously. When the collector-emitter voltage $V_{CE}$ is applied under the range of 0.8~1.6V, the HBT still operates in the transistor active region with current gain up to 10. When the collector-emitter voltage $V_{CE}$ is higher than 1.6V, the HBT operates in the NDR characteristic region. Hence, with the control of base current, the HBT can operate in different regimes. Therefore, the HBT with topee-shaped NDR characteristics is suitable for logic, high-speed, high-power amplifying, and photoelectronic integrated circuits applications.

While the invention has been described by way of example and in terms of the preferred embodiment, it is to be understood that the invention is not limited to the disclosed embodiment. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heterojunction bipolar transistor with topee-shaped negative-differential-resistance characteristics comprising:
   a substrate;
   a sub-collector layer located on the surface of the substrate;
   a collector control layer located on the surface of the sub-collector layer;
   a base control layer located on the surface of the collector control layer and with a setback layer;
   an emitter control layer located on the surface of the base control layer and with a δ-doped sheet; and
   an ohmic contract layer located on the surface of the emitter control layer.

2. The heterojunction bipolar transistor as defined in claim 1, wherein the substrate is an n$^+$-type InP substrate.

3. The heterojunction bipolar transistor as defined in claim 1, wherein the substrate is an n$^+$-type GaAs substrate.

4. The heterojunction bipolar transistor as defined in claim 1, wherein the sub-collector layer is an n$^+$-type InP sub-collector layer.

5. The heterojunction bipolar transistor as defined in claim 1, wherein the sub-collector layer is an n$^+$-type InGaAs sub-collector layer.

6. The heterojunction bipolar transistor as defined in claim 1, wherein the sub-collector layer is an n$^+$-type GaAs sub-collector layer.

7. The heterojunction bipolar transistor as defined in claim 1, wherein the collector control layer is an n$^+$-type $In_{0.53}Ga_{0.23}Al_{0.24}As$ collector control layer.

8. The heterojunction bipolar transistor as defined in claim 1, wherein the collector layer is an n-type InGaAs collector control layer.

9. The heterojunction bipolar transistor as defined in claim 1, wherein the collector control layer is an n-type InP collector control layer.

10. The heterojunction bipolar transistor as defined in claim 1, wherein the collector control layer is an n-type GaAs collector control layer.

11. The heterojunction bipolar transistor as defined in claim 1, wherein the collector control layer is an n-type InGaP collector control layer.

12. The heterojunction bipolar transistor as defined in claim 1, wherein the collector control layer is an n-type AlGaAs collector control layer.

13. The heterojunction bipolar transistor as defined in claim 1, wherein the base control layer is a p$^+$-type $In_{0.53}Ga_{0.23}Al_{0.24}As$ base control layer.

14. The heterojunction bipolar transistor as defined in claim 1, wherein the base control layer is a p$^+$-type InGaAs base control layer.

15. The heterojunction bipolar transistor as defined in claim 1, wherein the base control layer is a p$^+$-type GaAs base control layer.

16. The heterojunction bipolar transistor as defined in claim 1, wherein the base control layer is a p$^+$-type InGaP base control layer.

17. The heterojunction bipolar transistor as defined in claim 1, wherein the base control layer is a p$^+$-type AlGaAs base control layer.

18. The heterojunction bipolar transistor as defined in claim 1, wherein the base control layer comprises:
a first setback layer;
a p$^+$-type In$_{0.53}$Ga$_{0.23}$Al$_{0.24}$As layer located on the first setback layer; and
a second setback layer located on the p$^+$-type In$_{0.53}$Ga$_{0.23}$Al$_{0.24}$As layer, wherein the p$^+$-type In$_{0.53}$Ga$_{0.23}$Al$_{0.24}$As layer is located between the first setback layer and the second setback layer.

19. The heterojunction bipolar transistor as defined in claim 18, wherein the first setback layer and the second setback layer are undoped In$_{0.53}$Ga$_{0.23}$Al$_{0.24}$As layers.

20. The heterojunction bipolar transistor as defined in claim 1, wherein the base control layer comprises:
a first setback layer;
a p$^+$-type InGaAs layer located on the first setback layer; and
a second setback layer located on the p$^+$-type InGaAs layer, wherein the p$^+$-type InGaAs layer is located between the first setback layer and the second setback layer.

21. The heterojunction bipolar transistor as defined in claim 20, wherein the first setback layer and the second setback layer are undoped In$_{0.53}$Ga$_{0.23}$Al$_{0.24}$As layers.

22. The heterojunction bipolar transistor as defined in claim 1, wherein the base control layer comprises:
a first setback layer;
a p$^+$-type GaAs layer located on the first setback layer;
a second setback layer located on the p$^+$-type GaAs layer, wherein the p$^+$-type GaAs layer is located between the first setback layer and the second setback layer.

23. The heterojunction bipolar transistor as defined in claim 22, wherein the first setback layer and the second setback layer are undoped GaAs layers.

24. The heterojunction bipolar transistor as defined in claim 22, wherein the first setback layer and the second setback layer are undoped InGaP layers.

25. The heterojunction bipolar transistor as defined in claim 1, wherein the base control layer comprises:
a first setback layer;
a p$^+$-type AlGaAs layer located on the first setback layer; and
a second setback layer located on the p$^+$-type AlGaAs layer, wherein the p$^+$-type AlGaAs layer is located between the first setback layer and the second setback layer.

26. The heterojunction bipolar transistor as defined in claim 25, wherein the first setback layer and the second setback layer are undoped GaAs layers.

27. The heterojunction bipolar transistor as defined in claim 25, wherein the first setback layer and the second setback layer are undoped InGaP layers.

28. The heterojunction bipolar transistor as defined in claim 1, wherein the thickness of the base control layer is 100~400 Å.

29. The heterojunction bipolar transistor as defined in claim 1, wherein the emitter control layer is an n-type InP emitter control layer.

30. The heterojunction bipolar transistor as defined in claim 1, wherein the emitter control layer is an n-type InAlAs emitter control layer.

31. The heterojunction bipolar transistor as defined in claim 1, wherein the emitter control layer is an n-type GaAs emitter control layer.

32. The heterojunction bipolar transistor as defined in claim 1, wherein the emitter control layer is an n-type AlGaAs layer.

33. The heterojunction bipolar transistor as defined in claim 1, wherein the emitter control layer is an n-type InGaP emitter control layer.

34. The heterojunction bipolar transistor as defined in claim 1, wherein the emitter control layer comprises:
a δ-doped sheet; and
an n-type InP layer.

35. The heterojunction bipolar transistor as defined in claim 34, wherein the concentration of the δ-doped sheet is $10^{11}$ cm$^{-2}$~$10^{13}$ cm$^{-2}$.

36. The heterojunction bipolar transistor as defined in claim 1, wherein the emitter control layer comprises:
a δ-doped sheet; and
an n-type InGaAs layer.

37. The heterojunction bipolar transistor as defined in claim 36, wherein the concentration of the δ-doped sheet layer is $10^{11}$ cm$^{-2}$~$10^{13}$ cm$^{-2}$.

38. The heterojunction bipolar transistor as defined in claim 1, wherein the emitter control layer comprises:
a δ-doped sheet; and
an n-type InAlAs layer.

39. The heterojunction bipolar transistor as defined in claim 38, wherein the concentration of the δ-doped sheet is $10^{11}$ cm$^{-2}$~$10^{13}$ cm$^{-2}$.

40. The heterojunction bipolar transistor as defined in claim 1, wherein the emitter control layer comprises:
a δ-doped sheet; and
an n-type GaAs layer.

41. The heterojunction bipolar transistor as defined in claim 40, wherein the concentration of the δ-doped sheet is $10^{11}$ cm$^{-2}$~$10^{13}$ cm$^{-2}$.

42. The heterojunction bipolar transistor as defined in claim 1, wherein the emitter control layer comprises:
a δ-doped sheet; and
an n-type AlGaAs layer.

43. The heterojunction bipolar transistor as defined in claim 42, wherein the concentration of the δ-doped sheet is $10^{11}$ cm$^{-2}$~$10^{13}$ cm$^{-2}$.

44. The heterojunction bipolar transistor as defined in claim 1, wherein the emitter control layer comprises:
a δ-doped sheet; and
an n-type InGaP layer.

45. The heterojunction bipolar transistor as defined in claim 44, wherein the concentration of the δ-doped sheet is $10^{11}$ cm$^{-2}$~$10^{13}$ cm$^{m-2}$.

46. The heterojunction bipolar transistor as defined in claim 1, wherein the ohmic contact layer is an n$^+$-type InGaAs layer.

47. The heterojunction bipolar transistor as defined in claim 1, wherein the ohmic contact layer is an n$^+$-type GaAs layer.

* * * * *